United States Patent
Mandorlo et al.

(10) Patent No.: US 8,483,527 B2
(45) Date of Patent: Jul. 9, 2013

(54) DEVICE WITH WAVELENGTH SELECTIVE COUPLER FOR COLLECTING LIGHT EMITTED BY A LASER SOURCE

(75) Inventors: Fabien Mandorlo, Les Martres de Veyre (FR); Jean-Marc Fedeli, Saint Egreve (FR); Pedro Rojo-Romeo, Lyons (FR); Xavier Letartre, Ecully (FR); Christian Seassal, Lyons (FR)

(73) Assignees: Commissariat à l'énergie atomique et aux énergies alternatives, Paris (FR); Centre National de la Recherche Scientifique, Paris (FR)

( * ) Notice: Subject to any disclaimer, the term of this patent is extended or adjusted under 35 U.S.C. 154(b) by 123 days.

(21) Appl. No.: 13/001,138

(22) PCT Filed: Jul. 9, 2009

(86) PCT No.: PCT/EP2009/058778
§ 371 (c)(1),
(2), (4) Date: Jun. 20, 2011

(87) PCT Pub. No.: WO2010/004015
PCT Pub. Date: Jan. 14, 2010

(65) Prior Publication Data
US 2011/0243501 A1 Oct. 6, 2011

(30) Foreign Application Priority Data
Jul. 10, 2008 (FR) ...................... 08 54717

(51) Int. Cl.
*G02B 6/42* (2006.01)
*G02B 6/26* (2006.01)

(52) U.S. Cl.
USPC ................................ 385/32; 385/45

(58) Field of Classification Search
USPC ....................................... 385/32, 45
See application file for complete search history.

(56) References Cited

U.S. PATENT DOCUMENTS

| 5,398,256 A | 3/1995 | Hohimer |
| 5,469,460 A * | 11/1995 | Van Roijen et al. ............ 372/94 |
| 5,563,968 A | 10/1996 | Pennings et al. |

FOREIGN PATENT DOCUMENTS

| JP | 60 148185 | 8/1985 |
| JP | 3-6080 | 1/1991 |
| JP | 4-233274 | 8/1992 |
| JP | 2002-118324 | 4/2002 |
| WO | WO 95/05020 A1 | 2/1995 |
| WO | WO 97/44871 A1 | 11/1997 |

OTHER PUBLICATIONS

French Search Report issued Feb. 23, 2009, in Patent Application No. 0854717 (with English Translation of Category of Cited Documents).
International Search Report issued Dec. 4, 2009 in PCT/EP2009/058778 (with Translation of Category of Cited Documents).

* cited by examiner

*Primary Examiner* — Omar Rojas
(74) *Attorney, Agent, or Firm* — Oblon, Spivak, McClelland, Maier & Neustadt, L.L.P.

(57) ABSTRACT

A device for collecting light emitted by a laser source, including an optical wave guide arranged so as to collect a light signal emitted by the laser source, by coupling. The wave guide includes a loop coupled to a laser source in two coupling zones making it possible to recover optical modes circulating along the direction opposite to the required direction for the signal output from the device.

9 Claims, 2 Drawing Sheets

DEVICE WITH WAVELENGTH SELECTIVE COUPLER FOR COLLECTING LIGHT EMITTED BY A LASER SOURCE

TECHNICAL FIELD

This invention relates to a device for collecting light emitted by a laser source while controlling the wavelength obtained at the output from the collection device. It relates to the field of integration of optics into electronic systems.

STATE OF PRIOR ART

Laser sources for integration with electronics are currently made using various processes. The following main techniques can be distinguished.

A first technique concerns flat "ribbon" type lasers or "Fabry-Pérot" cavity lasers, for which the emission direction is known and the wavelength is easily predictable.

A second technique concerns "rotary mode" lasers. They comprise a disk or even a ring that may possibly be deformed (to form a hexagon, ellipse, racecourse, oval, etc.). The laser signal is then retrieved by placing a guide close to the emitting structure and controlling the distance between the two objects. Any electromagnetic mode that exists in the disk can be coupled and can go in any direction in the guide.

A third technique concerns photonic crystal PC lasers, for which the field distributions make couplings possible along the different predictable directions by simulation. This is inherently the most complex family of laser sources, because spatial electromagnetic distributions of the modes are very varied. PCs can either be used for couplings in the plane of the structure, or with guides placed on different planes. Two photonic crystals can also be used to make mirrors and thus obtain a laser cavity.

The signal can be collected in several ways: for a vertical emission laser, an end of an optical fibre can be brought close to the emission zone.

For coupling with a single guide and due to the symmetry of the device, it is difficult to predict the side on which the light signal will go out so that it can be collected in a single unique guide. For some resonators like disks, a "U" guide can be used that surrounds the disk on a single unique transfer zone. Note that the distance over which coupling is made is then significantly greater than in a tangent guide, and is of the order of one half-perimeter of the disk.

For a laser source with two degenerate modes (for example one mode rotating in the anticlockwise direction and the other mode rotating in the clockwise direction, at the same frequency), the coupling symmetry makes it impossible to predict which of the two modes will dominate the other. Uncertainties that occur during manufacturing (alignment, etc.) may favour one solution relative to the other, but it is then impossible to predict which will be the dominant solution.

One known solution consists of placing a mirror on one side of the guide to obtain a single optical output. Technologically, a number of additional steps may be necessary to make this mirror.

Document WO 95/05020 A divulges a coupling device for the collection of light emitted by a laser source. This device comprises a multimode coupler (MMI) composed of two inputs and two outputs. Two of the four MMI channels of the coupler are used as the laser source cavity. The last two channels form part of the device for collection of light emitted by the laser source. Therefore, the laser source is coupled to the light collection system at a single zone through the MMI.

PRESENTATION OF THE INVENTION

The device disclosed in this invention is easy to make and simply collects light output from the laser source and makes it interact. This device can be used to make a number of light signals output from different collection points interfere on the laser source, so as to control their resonance and to retrieve a resultant signal in a single unique guide.

The purpose of this invention is a light collection device to collect a light signal emitted by the optical source. The invention may perform two main functions: it may be used to select (or even adjust) available wavelengths after collection, and it can retrieve an optical signal in a single unique guide.

The purpose of this invention is a device for collection of light emitted by a laser source, the device comprising an optical wave guide collecting a light signal emitted by the laser source by coupling, characterised in that the light signal is emitted by the laser source in at least two distinct zones:

the wave guide comprises a part that will transport the light signal output from the device and a part forming a loop collecting the light signal emitted by the laser source by coupling in at least two coupling zones, the loop being separated from the laser source at the coupling zones by a material with a low refraction index, the loop comprises a first segment prolonged by a second segment prolonged by a third segment, the second segment, namely the recovery segment connecting the first coupling zone of the loop to the second coupling zone of this loop, the first and third segments, namely the junction segments, connect the second segment to the first and second inputs respectively of a two-to-one coupler, the output of which is connected to a fourth segment forming the part that will transport the light signal output from the device, the second segment has an optical path designed so that there is interference in each of the coupling zones between the part of the light signal captured at one of the coupling zones, and transported by the corresponding junction segment, and the part of the light signal captured at the other coupling zone and transported by the recovery segment, the optical paths of the first and third segments are arranged so that there is interference in the two-to-one coupler between signals transported by the junction segments.

According to one particular embodiment, the loop surrounds the laser source.

The loop may be in the form of a racket. This shape may be chosen to be symmetric, partly symmetric or asymmetric.

The device may also comprise active means for controlling the optical path of at least part of the loop.

The two-to-one coupler may be a Y coupler or any other device (MMI, etc.) performing this function.

The coupling zones may be isolated.

BRIEF DESCRIPTION OF THE DRAWINGS

The invention will be better understood and other advantages and special features will become clear after reading the description given below as a non-limitative example, accompanied by the appended drawings among which.

DETAILED DESCRIPTION OF PARTICULAR EMBODIMENTS

Figure 1:
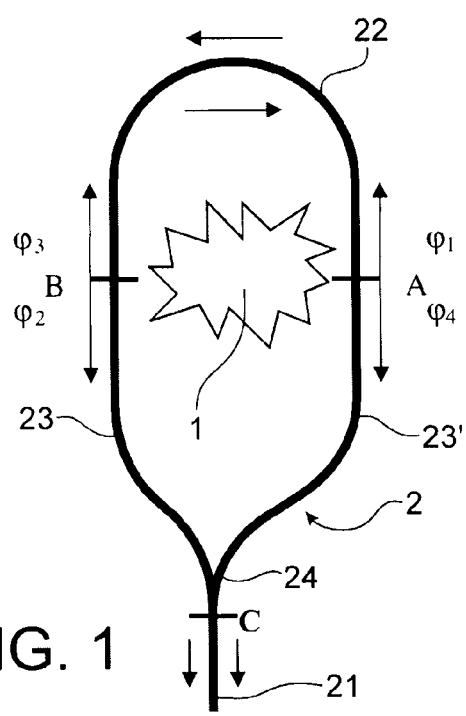
FIG. 1 is an explanatory diagram of a device for the collection of light emitted by a laser source according to this invention.

FIG. 1 is an explanatory diagram for a device for collection of light emitted by a laser source according to this invention.

In this figure, reference 1 represents an optical source and reference 2 represents an optical wave guide. The optical wave guide 2 comprises several segments, each performing a different role. The segment will transport the light signal output by the optical source 1 along the direction indicated by the arrows. The segment 22 connects two coupling points of the wave guide 2 to the optical source 1. The segments 23 and 23' are used to transport signals picked up at the coupling points to the segment 21. They collect not only the signals moving directly towards segment 21, but also the signals moving in the opposite direction and collected by segment 22. Therefore, segments 23 and 23' collect optical signals after they have interfered with the optical source through the segment 22. Segments 23 and 23' are connected to coupler 24 so as to provide one output signal from the device in the segment 21. Therefore, the general shape of the wave guide 2 is a loop.

The optical wave guide 2 is arranged so as to collect a light signal emitted by the optical source, by coupling. The light signal is collected at two or more separate locations on the wave guide, so as to create optical interference depending on the phase conditions imposed by the source at the coupling points and the path of light in the wave guide 2.

In the example shown in the diagram in FIG. 1, the loop composed of segments 22, 23 and 23' of the wave guide surrounds the optical source 1 and is arranged so that it can collect the light signal emitted by the source at two locations denoted by letters A and B, and make this light signal interfere.

The optical source 1 may indifferently be in the same plane as the optical wave guide 2, in a plane below the optical wave guide or in a plane above it. The laser source and the optical wave guide 2 are physically separate. The laser source and the wave guide in the coupling zones between the laser source and the wave guide (close to points A and B), may be separated by a material with a low refraction index such as silica $SiO_2$, over a distance between 10 nm and 500 nm. The shape of the loop is not important in itself because all that is important are the optical paths. It can be seen that there are two important zones in the optical wave guide 2: the loop bottom zone (in other words the zone between points A and B and facing the two-to-one coupler 24, therefore segment 22) and the zone connecting segment 22 to the two-to-one coupler 24.

The loop bottom zone influences the selection of the mode that will arrive at C (see FIG. 1), in other words in the first segment 21.

For the phase signal $\phi_1$ output from A and going towards the loop bottom to be able to exit from the loop, it must go through B: interference conditions at this second point with the phase in the resonator will then modify the global losses of the assembly composed of the laser and the segment 22, depending on whether interference is constructive or destructive. Thus, conditions (on the index and the physical length) of segment 22 can be found such that there are low losses for a resonant wavelength of the source over the entire range of possible resonant wavelengths of this source, so that laser operation at this very precise wavelength can be achieved.

Therefore, controlling the optical path 22 can control the interference condition, and therefore losses, and therefore more indirectly the laser wavelength.

By symmetry, the signal propagating in the other direction (from B to A) satisfies the same properties as mentioned above.

In the case of a source with degenerate modes (microdisks, rings and doughnuts), the same interference conditions can be satisfied for the two propagation directions (A to B and B to A).

As coupling at A and B becomes more intense, the influence of interference at the coupling zones also increases.

The other important zone of the optical wave guide 2 is the zone located between firstly points A and B and secondly point C. For this zone, if the different degenerate modes of the laser source cohabit in the guides, their interference in C can control whether or not there is a signal in the segment 21. The choice of the optical paths $\delta_{BC}$ (segment 23) and $\delta_{AC}$ (segments 23') that are not necessarily identical, depends on the wavelength of the laser mode, and phases $\phi_2$ and $\phi_4$.

In all cases, the output signal is collected in a single guide, after point C. This solution has the advantage that it does not require any additional steps compared with a single guide that is coupled to the resonator, because this loop is made at the same time as the rest of the guide. The lack of a reflecting mirror (as in prior art) and the possible symmetry depending on the direction of propagation of the modes considerably simplify manufacturing.

The device according to the invention can function according to three distinct cases.

In a first case, the laser 1 has a mode that enables propagation of light in the optical wave guide 2 along path B→A→C. The light does not pass through the segment 23. Segment 22 has an optical path that induces a phase shift of the wave that propagates in it. Photons output from point B can travel along two paths with a different phase shift: one path composed of segment 22 and one path in the laser itself between the two coupling zones. At A, they can interfere constructively inducing high losses for the laser, in other words many photons can leave the laser to enter the wave guide. Consequently, the laser cannot reach the laser regime as a function of coupling between the laser and the wave guide at A and B. Otherwise (destructive interference), the laser behaves almost as if the wave guide were not there. Losses in the entire structure are then very low and are similar to losses that would occur with the laser alone. The difference of the losses is then equal to the quantity of light resulting from interference at A and that moves towards point C to propagate in segment 21.

According to a second case, the laser 1 has a mode that enables light propagation in the optical wave guide 2 along the path A→B→C. This case corresponds to the previous case when point B is replaced by point A and vice versa. In this case, the light does not pass through segment 23'.

In a third case (stationary mode), segment 22 plays exactly the same role for the previous two modes, in other words the optical paths are identical but they are followed in opposite directions. As for the previous cases, if interference at A and B is constructive, the laser cannot reach the laser condition, which will then mean that there is no output signal in segment 21. Otherwise, the source will maintain its laser condition, but segments 23 and 23' will have to be studied to know whether or not there is an output signal in segment 21. The phase shift at point C between photons output from points A and B may cause constructive interference (there is a signal present at point C) or destructive interference (no signal at point C) or it may lead to intermediate solutions. The very special case of a laser source with tunnel mode is worth noting; with a symmetrical path, one laser mode out of two is in destructive interference at point C, while the other modes are in constructive interference.

It would be possible to use active means (for example thermally active means, or by modifying the concentration of carriers (with an electric field or by any other means)) to control the different optical paths, for example using segment 22, so as to:

compensate for any misalignments and therefore minor changes on the optical path of the segment 22, between the lithography of the guides and of the source, if these two objects are made one after the other.

slightly modify the laser wavelength (tuning/trimming) (by a few nanometers).

check the laser wavelength by choosing the segment 22 so that if its optical path is slightly modified, it would be possible to change from one laser mode to another, considerably reducing the losses associated with the corresponding wavelengths.

It may be necessary to actuate the optical path $\delta_{BC}$ or $\delta_{AC}$ if the wavelength might need to vary, and if it is required to use interference in the coupler to achieve modulation.

Considering that all wave guide segments are lithographed at the same time, no additional steps are necessary to make the device if we use a technology similar to that developed for the WADIMOS project (http://wadimos.intec.ugent.be/) and if it is required to simply favour a particular mode but not to include any active elements.

The use of an SOI substrate or an amorphous silicon substrate makes it possible to place the optical source above or below the plane of the loop. However, it would also be possible to envisage lithographing the optical source at the same time as the wave guide 2. Several additional steps will be necessary in the case of an active correction to the optical path by actuators. However, these additional steps are known to those skilled in the art.

Figure 2:
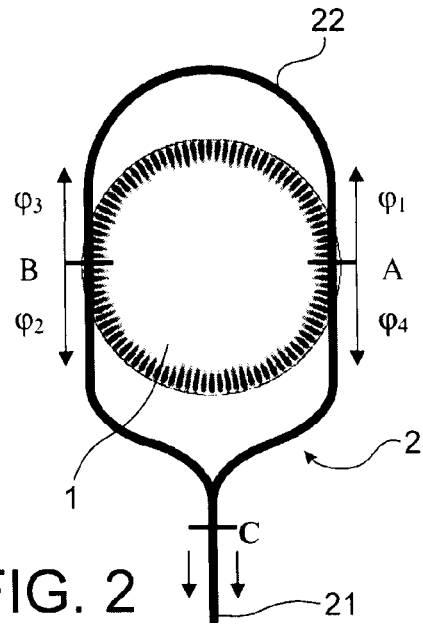
FIG. 2 shows a first embodiment of the invention.

FIG. 2 shows a first embodiment of the invention. In this case, the optical source 1 consists of a micro-disk with tunnel modes. The optical wave guide 2 comprises a first segment 21 identical to the first segment in FIG. 1. It also comprises a second segment 22 forming the loop of the device. The loop is symmetrical in this example embodiment.

Figure 5:
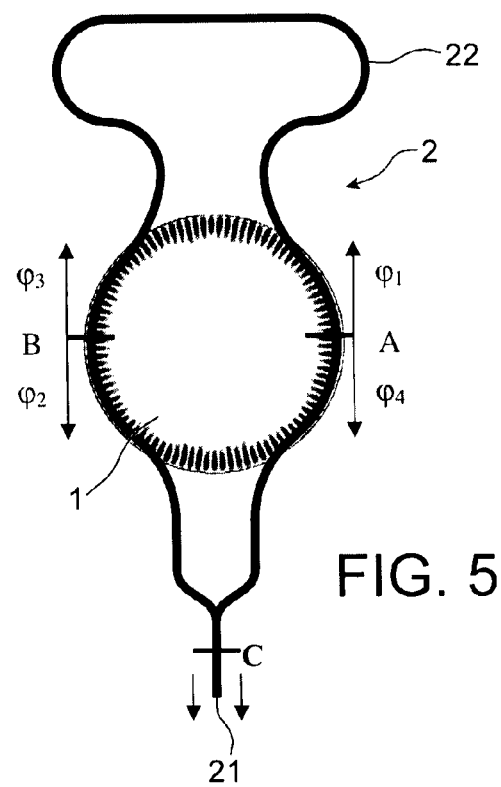
FIG. 5 shows a variant of the first embodiment of the invention.

FIG. 5 shows a variant of the first embodiment. In this case the optical source 1 is composed of a ring resonator. This figure shows the case in which the coupling is done at coupling zones and not at coupling points, which is suitable for curved guides. In this example embodiment, the loop is symmetric and the coupling zones are not isolated.

Figure 3:
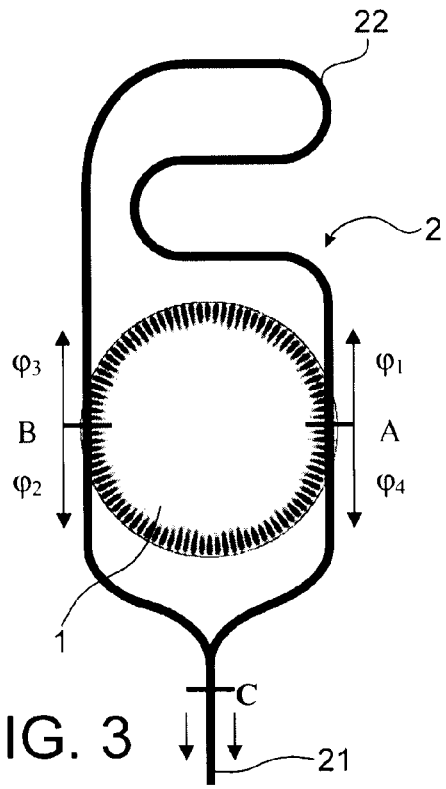
FIG. 3 shows a second embodiment of the invention.

FIG. 3 shows a second embodiment of the invention. The optical source 1 in this case is composed of a micro-disk with tunnel modes. The optical wave guide 2 comprises a first segment 21 identical to the first segment in FIG. 1. It also comprises a second segment 22 forming the loop of the device. The loop is asymmetric in this example embodiment.

Figure 4:
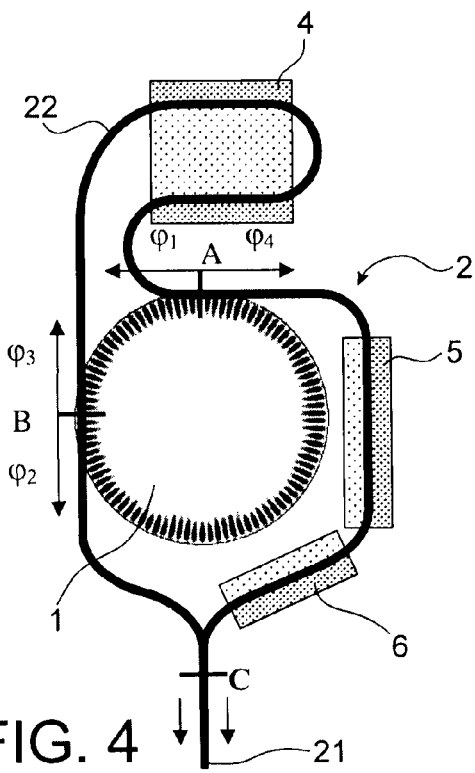
FIG. 4 shows a third embodiment of the invention.

FIG. 4 shows a third embodiment of the invention. The optical source 1 in this case is composed of a micro-disk with tunnel modes. The optical wave guide 2 comprises a first segment 21 identical to the first segment in FIG. 1. It also comprises a second segment 22 forming the loop of the device. In this example embodiment, the loop is asymmetric and it comprises actuators 4, 5 and 6 to control the optical paths. The actuator 4 controls optical path $\delta_{AB}$, while actuators 5 and 6 control optical path $\delta_{AC}$.

The actuator 4 controls the interference condition at point B for propagation modes and at point A for counter-propagation modes, a stationary mode being a combination of the two previous types of modes. The actuator may be a thermal actuator. Further information on this subject can be found in the article "High-speed optical modulation based on carrier depletion in a silicon waveguide", A. Liu et al., Optics Express, vol. 15, No. 2, Jan. 22, 2007, pages 660 to 668. Guide portions in which carrier depletion is varied can also be used to vary the optical index. This second method is often used on modulators. This actuator can interact with the laser source to define the wavelength of some signals transported by segments 23 and 23'. Therefore, a laser signal may or may not be chosen (modulation role), or the wavelength can be changed (mode skip), or the wavelength can be fine tuned. It is quite possible for a single actuator to do mode skip, modulation and tuning of the wavelength.

Actuators located elsewhere than on segment 22 play a different role from the actuator located on this segment because they cannot control the laser wavelength. They can correct a slight asymmetry between paths 23 and 23' to optimise the interference condition at point C. They can also modulate the intensity of the resultant signal in segment 21, in which case asymmetry of paths 23 and 23' is preferable.

The optical index control effects may be based on carrier depletion and for example are described in the following documents:

"Low loss and high speed silicon optical modulator based on a lateral carrier depletion structure" by D. Marris-Morini et al., Optics Express, vol. 16, No 1, Jan. 7, 2008, pages 334 to 339;

"Reconfigurable Optical Add-Drop Multiplexer Using Microring Resonators" by E. J. Klein et al., IEEE Photonics Technology Letters, vol. 17, No 11, November 2005, pages 2358 to 2360.

The invention is particularly applicable to the domain of wavelength selective optical couplers in integrated circuits comprising optical sources (tunnel mode micro-resonators, photonic crystals, etc.), to collect a signal in a single and unique guide.

The invention claimed is:

1. A device comprising:
a laser source; and
a continuous optical wave guide that collects a light signal emitted by the laser source by coupling,
wherein the light signal is emitted by the laser source in at least two distinct zones,
the wave guide comprises a part configured to transport the light signal output from the device and a part forming a loop that collects the light signal emitted by the laser source in at least two coupling zones by coupling, the loop being separated from the laser source at the coupling zones by a material with a low refraction index,
the loop comprises a first segment prolonged by a second segment prolonged by a third segment, the second segment connecting the first coupling zone of the loop to the second coupling zone of this loop,
the first and third segments, as junction segments, connect the second segment to the first and second inputs respectively of a two-to-one coupler, an output of which is connected to a fourth segment forming the part configured to transport the light signal output from the device,
the second segment includes an optical path configured so that there is interference in each of the coupling zones, between a part of the light signal captured at one of the coupling zones and transported by the corresponding junction segment, and a part of the light signal captured at another coupling zone and transported by the second segment, and optical paths of the first and third segments are configured so that there is interference in the two-to-one coupler between signals transported by the junction segments.

2. A device according to claim 1, in which the loop surrounds the laser source.

3. A device according to claim 1, in which a shape of the loop is symmetric.

4. A device according to claim 1, further comprising means for controlling the optical path of at least part of the loop.

5. A device according to claim 1, in which the two-to-one coupler is a Y coupler.

6. A device according to claim 1, in which the coupling zones are isolated.

7. A device according to claim 1, in which a shape of the loop is partly symmetric.

8. A device according to claim 1, in which a shape of the loop is asymmetric.

9. A device according to claim 1, in which the two-to-one coupler is a multimode interferometric (MMI) coupler.

* * * * *